(12) United States Patent
Lieutier

(10) Patent No.: US 10,719,549 B2
(45) Date of Patent: Jul. 21, 2020

(54) QUERYING A DATABASE BASED ON A PARAMETRIC VIEW FUNCTION

(71) Applicant: Dassault Systems, Velizy Villacoublay (FR)

(72) Inventor: Andre Lieutier, Puyricard (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 264 days.

(21) Appl. No.: 15/793,774

(22) Filed: Oct. 25, 2017

(65) Prior Publication Data

US 2018/0137118 A1   May 17, 2018

(30) Foreign Application Priority Data

Nov. 14, 2016   (EP) .................................... 16306488

(51) Int. Cl.
*G06F 16/51* (2019.01)
*G06T 17/20* (2006.01)
(Continued)

(52) U.S. Cl.
CPC ............ *G06F 16/51* (2019.01); *G06F 16/248* (2019.01); *G06F 16/532* (2019.01); *G06F 16/56* (2019.01);
(Continued)

(58) Field of Classification Search
CPC .... G06F 16/51; G06F 16/5854; G06F 16/532; G06F 16/248; G06F 16/56; G06F 17/10;
(Continued)

(56) References Cited

U.S. PATENT DOCUMENTS 5,966,140 A * 10/1999 Popovic ................. G06T 17/20
345/441
6,397,206 B1   5/2002 Hill
(Continued)

FOREIGN PATENT DOCUMENTS

CN           1647112 A    7/2005
CN         101059335 A   10/2007
(Continued)

OTHER PUBLICATIONS

Assfalg, Jürgen, Alberto Del Bimbo, and Pietro Pala. "Retrieval of 3d objects using curvature maps and weighted walkthroughs." In 12th International Conference on Image Analysis and Processing, 2003. Proceedings., pp. 348-353. IEEE, 2003. (Year: 2003).*
(Continued)

*Primary Examiner* — Jesse P Frumkin
(74) *Attorney, Agent, or Firm* — Hamilton, Brook, Smith & Reynolds, P.C.

(57) ABSTRACT

A computer-implemented method queries a database that comprises modeled objects. Each modeled object represents a physical attribute of a respective real object. The database comprises for each modeled object, a respective simplicial complex. The method comprises providing a query that includes a signature criterion, and returning, as results of the query, respective modeled objects of the database. The respective modeled object is returned based on an extent to which the respective modeled object has a respective simplicial complex that respects the signature criterion. Such method system improves the field of searching modeled objects in a database.

15 Claims, 10 Drawing Sheets

(51) Int. Cl.

| | | |
|---|---|---|
| *G06F 16/56* | (2019.01) | |
| *G06F 16/248* | (2019.01) | |
| *G06F 16/532* | (2019.01) | |
| *G06K 9/00* | (2006.01) | |
| *G06F 17/10* | (2006.01) | |
| *G06K 9/62* | (2006.01) | |
| *G06F 16/583* | (2019.01) | |
| *G06F 30/00* | (2020.01) | |

(52) U.S. Cl.
CPC .......... *G06F 16/5854* (2019.01); *G06F 17/10* (2013.01); *G06F 30/00* (2020.01); *G06K 9/00208* (2013.01); *G06K 9/6211* (2013.01); *G06T 17/20* (2013.01)

(58) Field of Classification Search
CPC .. G06F 17/50; G06K 9/00208; G06K 9/6211; G06T 17/20
See application file for complete search history.

(56) References Cited

U.S. PATENT DOCUMENTS

| | | | |
|---|---|---|---|
| 6,570,568 B1* | 5/2003 | Horn ................. | G06T 17/20 345/428 |
| 6,615,503 B1 | 9/2003 | Nzomigni et al. | |
| 6,642,929 B1* | 11/2003 | Essafi ................. | G06K 9/46 345/581 |
| 6,721,614 B2 | 4/2004 | Duncan et al. | |
| 6,768,928 B1 | 7/2004 | Nagasawa et al. | |
| 6,778,970 B2 | 8/2004 | Au | |
| 7,027,054 B1 | 4/2006 | Cheiky | |
| 7,269,808 B2 | 9/2007 | Bruce et al. | |
| 7,583,272 B2* | 9/2009 | Ramani ............ | G06F 17/50 345/621 |
| 7,657,083 B2 | 2/2010 | Parr | |
| 7,688,318 B2 | 3/2010 | O'Malley, III et al. | |
| 7,733,340 B1 | 6/2010 | Desimone et al. | |
| 7,913,190 B2 | 3/2011 | Grimaud | |
| 8,248,407 B2 | 8/2012 | Deslandes | |
| 8,416,240 B1 | 4/2013 | Kuffner | |
| 8,606,774 B1 | 12/2013 | Makadia | |
| 8,659,596 B2 | 2/2014 | Corazza | |
| 8,812,272 B2 | 8/2014 | Martin et al. | |
| 8,976,179 B2 | 3/2015 | Kuffner | |
| 8,982,122 B2 | 3/2015 | Corazza | |
| 9,239,895 B2 | 1/2016 | Huang et al. | |
| 9,304,332 B2 | 4/2016 | Fonte | |
| 9,449,430 B2 | 9/2016 | Janvier | |
| 9,798,835 B2 | 10/2017 | Rorato | |
| 9,830,703 B2 | 11/2017 | Meyer | |
| 9,881,388 B2 | 1/2018 | Rorato et al. | |
| 9,916,345 B1 | 3/2018 | Makadia | |
| 9,916,538 B2 | 3/2018 | Zadeh et al. | |
| 10,198,488 B2 | 2/2019 | Marini | |
| 10,303,784 B2 | 5/2019 | Rorato | |
| 2002/0008700 A1 | 1/2002 | Fuki | |
| 2002/0095276 A1 | 7/2002 | Rong et al. | |
| 2002/0167516 A1* | 11/2002 | Loop ................. | G06T 17/20 345/423 |
| 2003/0191627 A1 | 10/2003 | Au | |
| 2004/0122630 A1 | 6/2004 | Fife | |
| 2007/0279414 A1 | 12/2007 | Vandenbrande | |
| 2008/0143714 A1 | 6/2008 | Huang | |
| 2008/0260238 A1* | 10/2008 | Pfister ............... | G06K 9/00208 382/154 |
| 2009/0182450 A1 | 7/2009 | Goldschmidt | |
| 2010/0082142 A1 | 4/2010 | Usadi et al. | |
| 2010/0121626 A1* | 5/2010 | Montana ............. | G06F 17/50 703/6 |
| 2011/0069336 A1* | 3/2011 | Lin ................... | H04N 1/6016 358/1.9 |
| 2011/0224813 A1 | 9/2011 | Takatsuka | |
| 2012/0078587 A1 | 3/2012 | Martin et al. | |
| 2012/0173212 A1 | 7/2012 | Rameau | |
| 2014/0184594 A1 | 7/2014 | Janvier | |
| 2014/0188439 A1 | 7/2014 | Rorato | |
| 2014/0192050 A1 | 7/2014 | Qiu | |
| 2014/0354636 A1 | 12/2014 | Rorato et al. | |
| 2014/0379309 A1 | 12/2014 | Banta et al. | |
| 2015/0032420 A1 | 1/2015 | Tristano et al. | |
| 2015/0199850 A1 | 7/2015 | Uematsu et al. | |
| 2016/0004739 A1* | 1/2016 | Tyercha ............ | G06F 16/2365 707/743 |
| 2016/0019270 A1 | 1/2016 | Jones et al. | |
| 2016/0117792 A1 | 4/2016 | Rolland-Neviere | |
| 2016/0217610 A1 | 7/2016 | Liu et al. | |
| 2016/0350335 A1 | 12/2016 | Rorato | |
| 2016/0350387 A1 | 12/2016 | Marini et al. | |
| 2017/0371948 A1 | 12/2017 | Rorato | |
| 2018/0004836 A1* | 1/2018 | Lewis ................ | G06F 17/147 |
| 2019/0179977 A1 | 6/2019 | Van der Velden | |

FOREIGN PATENT DOCUMENTS

| | | |
|---|---|---|
| CN | 101995231 A | 3/2011 |
| EP | 0 646 884 A2 | 4/1995 |
| EP | 0 646 884 A3 | 7/1995 |
| EP | 0 964 364 | 12/1999 |
| EP | 2 169 567 | 3/2010 |
| EP | 2 387 004 | 11/2011 |
| JP | 2000-57184 A | 2/2000 |
| JP | 2001250130 | 9/2001 |
| WO | WO 2004/068300 | 8/2004 |
| WO | WO 2008/094170 | 8/2008 |
| WO | WO 2011/103031 | 8/2011 |
| WO | WO 2015/085435 | 12/2014 |
| WO | WO-2015085435 A1 * | 6/2015 |

OTHER PUBLICATIONS

3DPartFinder by 3DSemantix—Geometric search engine > Home; http://www.3dpartfinder.com. 2 pages.

Altmeyer, J., et al., "Reuse of Design Objects in CAD Frameworks", IEEE/ACM International Conference on Computer-Aided Design, Digest of Technical Papers, pp. 754-761, Nov. 6, 1994.

Babic, B., et al., "A Review of Automated Feature Recognition with Rule-Based Pattern Recognition", Computers in Industry, 59:321-337 (2008).

Beardsly, J., "Seamless Servers: The case for and against", Massively Multiplayer Game Development, Section 3.1, 211-227.

Besplov, D., et al., "Local Feature Extraction and Matching Partial Objects", Computer Aided Design, vol. 38: 1020-1037 (2006).

Biasotti, S., et al., "Sub-part correspondence by structural descriptors of 3D shapes", Computer Aided Design, 38(9): 1002-1019 (Sep. 2006).

Boltcheve, D., "An Iterative Algorithm for Homology Computation on Simplical Shapes", Computer Aided Design, vol. 43, No. 11, pp. 1457-1467 Sep. 2, 2011.

Briere-Cote, A., et al., "Comparing 3D CAD Models: Uses, Methods, Tools and Perspectives", Computer-Aided Design and Applications, 9(6): 771-794 (2002).

Cardone, A., et al. "A Survey of Shape Similarity Assessment Algorithms for Product Design and Manufacturing Applications", Journal of Computing and Information Science in Engineering, vol. 3 No. 2, pp. 109-118, Jan. 1, 2003.

Chiang, L., et al. "Identification of Patterns of Repeated Parts in Solid Objects", IMATI Report Series, pp. i-111, Nov. 2, 2016.

Clark, D.E.R., et al., "Benchmarking shape signatures against human perceptions of geometric similarity", Computer-Aided Design, 38(9): 1038-1051 (Sep. 2006).

Cornelio, A., et al., "Integration and Cataloging of Engineering Design Information", Systems Integration '90, IEEE Comput., Soc., US, pp. 720-729 (Apr. 23, 1990).

Creo™ Parametric Data Sheet, © 2011 Parametric Technology Corporation, http://www.creo.uk.com/creo_parametric_mapping.htm, last accessed Mar. 27, 2014.

(56) References Cited

OTHER PUBLICATIONS

Dang, Q.V., et al., "Similarity Detection for Free-Form Parametric Models", 21st International Conference on Computer Graphics, Visualization and Computer Vision, pp. 239-248 (2013).
Daras, P., et al., "A 3D Shape Retrieval Framework Supporting Multimodal Queries", Int J. Comput Vis 89: 229-247 (2010).
EP Search Report for EP 10 30 6026 dated Feb. 3, 2011.
EP Search Report for EP 12 30 6720 dated Jul. 4, 2013.
EP Search Report for EP 12 30 6721 dated May 13, 2013.
EP Search Report for EP 13 30 5700 dated Aug. 14, 2013.
EP Search Report for EP 16 17 6763 dated Dec. 1, 2016.
EP Search Report for EP 16 30 6488 dated May 23, 2017.
EP Search Report for EP 16 30 6790 dated Jun. 7, 2017.
Falcidieno, B., et al., "A System for Extracting and Representing Feature Information Driven by the Application Context", Proceedings of the IEE International Conference on Robotics and Automation, 1672-1678 (1990).
Fonseca, M.J., et al., "Towards content-based retrieval of technical drawings through high-dimensional indexing", Computers and Graphics, 27(1): 61-69 (Feb. 2003).
Frosini, P., et al. "Combining Persistent Homology and Invariance Groups for Shape Comparison", Discrete & Computational Geometry, vol. 55, No. 2, pp. 373-409, Feb. 2, 2016.
Funkhouser, T., et al., "Modeling by Example", ACM Transactions on Graphics, 23(3): 652-663 (Aug. 1, 2004).
Funkhouser, T., et al., "A Search Engine for 3D Models", ACM Transactions on Graphics, vol. V, No. N 10 202002.
Gordon, L., "Comparing 3D CAD Modelers 9, 10, What Designers should know about history-based and dynamic schemes", Machine Design, Nov. 22, 2006.
Imoru, C.O., et al., "On a Version of the Banach's Fixed Point Theorum", General Mathematics, vol. 16, No. 1, pp. 25-32 (2008).
Ismail, et al., "Feature recognition patterns for form features using boundary representation models", International Journal of Advanced Manufacturing Technology Springer-Veraguk, vol. 20, No. 8, pp. 553-556, (2002).
Kao, et al, "Extraction of 3D Object Features from CAD Boundary Representation using the Super Releaton Graph Method", Transactions on Pattern Analysis and Machine Intelligence, IEEE, Piscataway, USA, vol. 17, No. 12, pp. 1228-1233, Dec. 1, 1995.
Kazhdan, M., et al., "Harmonic 3D Shape Matching", ACM SIGGRAPH Symposium on Computer Animation, p. 191 (Jul. 21, 2002).
Kazhdan, M., et al., "Rotation Invariant Spherical Harmonic Representation of 3D Shape Descriptors", Eurographics Symposium on Geometry Processing, 9 pages (2003).
Lee, K.S., et al., "Framework of an evolutionary design system incorporating design information and history", Computers in Industry, 44(3): pp. 205-227 (Apr. 2001).
Ma, L., et al. Automatic Discovery of Common Design Structures in CAD models, Computer & Graphics 34, pp. 545-555 (2010).
Maranzana, R., "3D Data Mining Part and Information Re-Use in a PLM Context"; Proceedings of GT2007, May 14-17, 2013, Montreal, CA, ASME Paper: GT2007-27966, American Society of Mechanical Engineers, NY, NY 2007. http://dx.doi.org/10.1115/GT2007-27966, 37 pages (2013).
Munkres, J.R., "Elements of algebraic topology", Addison-Wesley Publishing Company, Inc. 1984.
Oudot, S., Topological Signatures:, Presentation given in Springs School in LA Marsa, pp. 1-86, Apr. 2016.
Pauly, et al., "Discovering structural regularity in 3D geometry", ACM Transactions on Graphics (TOG)—Proceedings of ACM SIGGRAPH TOG Homepage, vol. 27; No. 3, Aug. 2008.
Papadakis, P., et al., "Efficient 3D shape matching and retrieval using a concrete radialized spherical projections representation", Science Direct, 40: 2437-2452 (2007).
Petre, R.D., et al., "An experimental evaluation of view-based 2D/3D indexing methods" 2010 IEEE 26th Convention of Electrical and Electronic Engineers in Israel, pp. 924-928, Nov. 2010.
Santa-Cruz, D., et al., "Compression of Parametric Surfaces for Efficient 3D Model Coding", VCIP, 4671: 280-291 (2002).
Shih, R., Parametric Modeling with Creo™ Parametric: An Introduction to Creo™ Parametric 1.9 SDC Publications © 2011 (table of contexts only).
Shikhare, D., et al. "Compression of Large 3D Engineering Models Using Automatic Discovery of Repeating Geometric Features", National Centre for Software Technology, 233-240 (2001).
Tangelder, J., et al., "A Survey of Content Based 3D Shape Retrieval Methods", Multimedia Tools and Applications, Kluwer Academic Publishers, vol. 39, No. 3, pp. 441-471; Dec. 8, 2007.
Wagner, et al. "Modeling Software with Finite State Machines" Auerbach Publications, 2006.
Wang, et al. "EQSM: An efficient high quality surface grid generation method based on remeshing", Computer Methods in Applied Mechanics and Engineering, North Holland, Amsterdam, vol. 195 No. 41-43, pp. 5621-5633, Aug. 15, 2006.
Werghi, D., et al. "Extracting Ordered Patterns from a Triangular Mesh Surface", IEEE Potentials, IEEE, NY, NY, USA, vol. 30, No. 6, pp. 34-43, Nov. 1, 2011.
Working with Pattern Recognition; http://learningexchange.ptc.com/tutorial/519/working-with-pattern-recognition.
Yang, M., et al., "A Survey of Shape Feature Extraction Techniques", Peng-Yeng Yin, Pattern Recognition, In-Tech, pp. 43-690 (2008).
Boussuge, et al., "Template-based Geometric Transformations of a Functionally Enriched DMU into FE Assembly Models," Computer-Aided Design & Applications, 11(4), 436-449 (2014).
Marchetta, et al., "An artificial intelligence planning approach to manufacturing feature recognition," Computer-Aided Design, 42:248-256 (2010).
European Search Report, EP18212155.8, "Methods and Systems for Authoring Simulation Scenarios," dated May 24, 2019.
Danglade et al., "A Priori Evaluation of Simulation Models Preparation Processes Using Artificial Intelligence Techniques," Computers in Industry, vol. 91, pp. 45-61 (2017).
Danglade et al., "On the use of Machine Learning to Defeature CAD Models for Simulation," Computer Aided Design & Applications, vol. 11, No. 3, pp. 358-368 (2013).
Li et al., "Preparation of CAD Model for Finite Element Analysis," 2010 Int'l Conf. on Computer Mechatronics Control and Electronic Engineering, CMCE 2010, pp. 491-494 (2010).
Oberg et al., "Machinery's Handbook 27th Edition," Industrial Press, Inc., New York, N.Y. (2004).

* cited by examiner providing a query that includes a signature criterion that involves a value of the signature function — S10 returning, as results of the query, respective modeled objects of the database, a respective modeled object being returned based on an extent to which the respective modeled object has a respective simplicial complex that respects the signature criterion — S20

FIG. 3 providing modeled objects — S50 determining, for each respective modeled object, a respective simplicial complex — S60 storing a relation between each modeled object and its respective simplicial complex — S70

FIG. 4

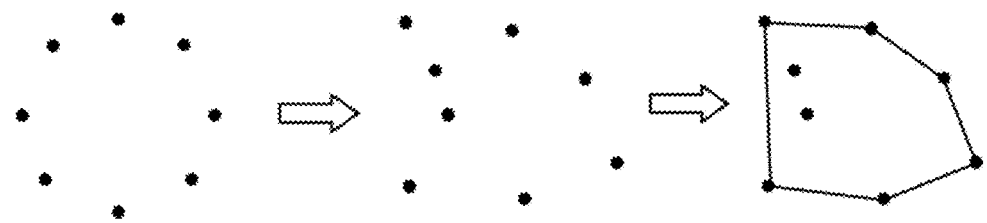
FIG. 17
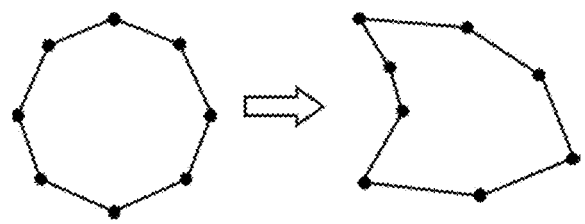
FIG. 18
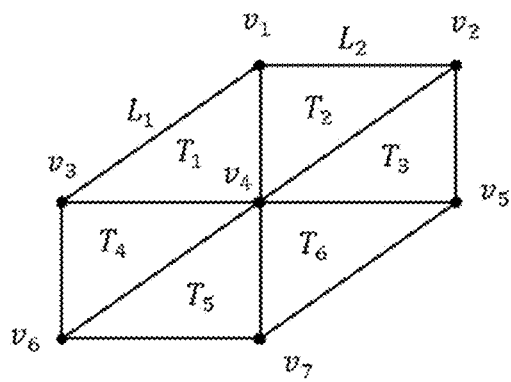 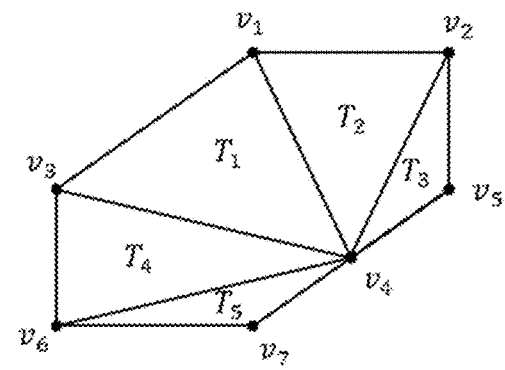
FIG. 19              FIG. 20

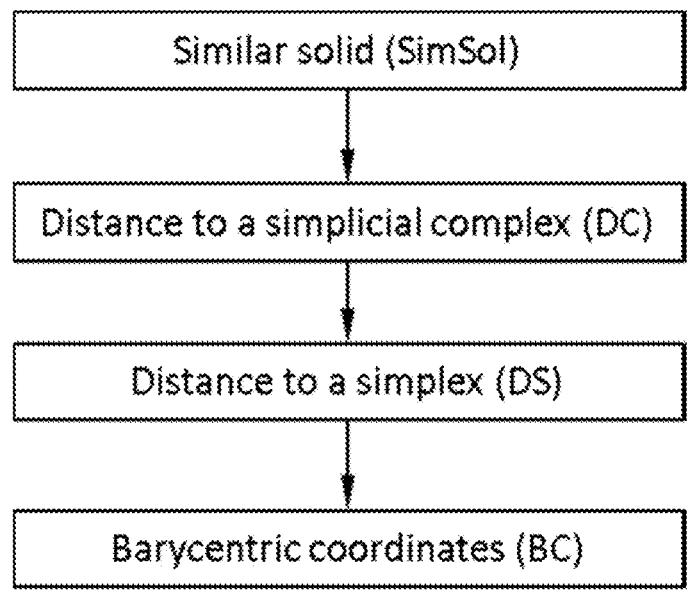
FIG. 23
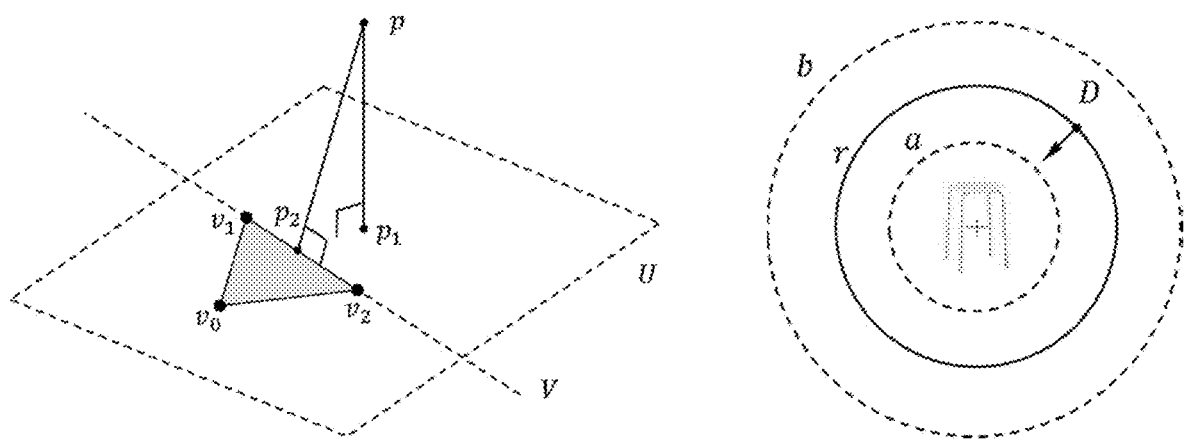
FIG. 24
FIG. 25

QUERYING A DATABASE BASED ON A PARAMETRIC VIEW FUNCTION

RELATED APPLICATION(S)

This application claims priority under 35 U.S.C. § 119 or 365 to Europe, Application No. EP16306488.4, filed Nov. 14, 2016. The entire teachings of the above application(s) are incorporated herein by reference.

FIELD OF THE INVENTION

The invention relates to the field of computer programs and systems, and more specifically to methods, systems and programs for querying and/or constructing a database that comprises modeled objects each representing a physical attribute of a respective real object, and to such a database.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In such a context and in other contexts, there is a need to search existing modeled objects in a database according to different criteria.

Searching modeled objects in a database according to a predefined criterion may often be performed through three steps. The first step is to compute and associate to each modeled object of the database the value of at least one so-called "signature" or "descriptor" function for the modeled object. A signature function is a function that outputs compact information that is called "signature" and that synthetizes a typical aspect of the input. The second step is for the user to specify a query, for example by setting a specific signature value. This signature value can correspond to a selected object and the goal may be to find similar objects in the database. Alternatively, the signature value can correspond to an object being designed and the goal is, again, to find similar objects in the database. The third step is the searching step. It is for the system to find objects of the database a signature value of which corresponds to the user-inputted signature value. Signature values are massively compared during this step.

A signature may ideally be designed to require a small amount of memory, to be easy to compute and to be very rapid to compare, and yet lead to a relevant result with a high recall and a high precision.

FIG. 1 shows a diagram illustrating existing searching software products.

These existing software make use of numerical signatures based on planar silhouettes and view directions in order to index 3D modeled objects in a database. The following paper provides an example: Raluca Diana Petre, Zaharia Titus, Françoise Preteux, *An experimental evaluation of view-based 2D/3D indexing methods,* 2010 IEEE 26th Convention of Electrical and Electronics Engineers in Israel, November 2010, Israel. pp. 924-928.

Each 3D modeled object gives birth to a plurality of numerical signatures in the database, each one being computed according to said object and to a respective view direction. Database indexes can be understood as a finite (but very large) set of points in the space of numerical signatures. Populating the database is performed offline. Given the planar silhouette of an input 3D modeled object, a search may be to compute its numerical signature and to find the closest one in the database. This yields the output similar 3D modeled object and the output view direction associated with this closest numerical signature. This computation is performed inline, according to the user interaction.

However, these existing software are inaccurate in some situations. This is illustrated with reference to FIG. 2.

Suppose that two 3D modeled objects A and B are stored in a database with respective signature(s). Also suppose that one wants to query the database to find the closest object to an input object, and suppose that A is physically the correct result and should thus be returned by the query.

Now, let $\sigma(A, U)$ and $\sigma(A, V)$ be the respective numerical signatures of 3D object A according to view directions U and V stored in the database. Let $\sigma(B, D)$ be the numerical signature of 3D object B according to view direction D stored in the database. Let $\sigma^*$ be the numerical signature of a silhouette of the input object provided by the query. Clearly, as shown on the figure, the numerical signature in the database that is closest to $\sigma^*$ can be $\sigma(B, D)$ so that object B can be (incorrectly) found to be the object of the database most similar to the input object. For A to have been outputted as the result of the query, it would have been necessary that the numerical signature $\sigma(A, W)$ of object A according to view direction W be also stored in the database. But although represented on the figure for the purpose of the explanation, and although view direction W is close to U and V, numerical signature $\sigma(A, W)$ may simply not be in the database, depending on how the database was built. In such a case, the correct solution is unfortunately out of reach. This is because the database simply cannot just store all possible numerical signatures of a 3D object, due to obvious memory reasons.

Thus, despite the existing literature, there is still a need for improving the field of searching modeled objects in a database.

SUMMARY OF THE INVENTION

It is therefore provided a computer-implemented method ("querying method" or "inline process") for querying a database that comprises modeled objects. Each modeled object represents a physical attribute of a respective real object. The database comprises, for each modeled object, a respective simplicial complex. The respective simplicial complex of a modeled object is the image of the couple made of a meshing of the parametric domain of a parametric view function and the modeled object, by the composition of the parametric view function with a signature function. The parametric view function is continuous over the parametric domain and over the modeled object space. The signature function is continuous over the range of the parametric view function.

The method comprises providing a query that includes a signature criterion that involves a value of the signature function. The method also comprises returning, as results of the query, respective modeled objects of the database. A respective modeled object is returned based on an extent to which the respective modeled object has a respective simplicial complex that respects the signature criterion.

The querying method may comprise one or more of the following:
- the extent to which a respective modeled object has a respective simplicial complex that respects the signature criterion depends on a distance between the value of the signature function of the signature criterion and the respective simplicial complex in the range of the signature function;
- each respective meshing of the parametric domain of the parametric view function respects a precision criterion in the range of the signature function;
- each respective simplicial complex only has non-degenerated simplexes;
- the physical attribute is the 3D shape, the modeled objects being 3D modeled objects, and the parametric view function is a 2D silhouette function, the parametric domain being a domain of geometrical view parameters; and/or
- the domain of geometrical view parameters includes a domain of geometrical view directions.

It is further provided such a database. The database thus comprises as above modeled objects and, for each modeled object, a respective simplicial complex.

It is further provided a computer-implemented method ("constructing method" or "offline process") for constructing such a database.

The constructing method may comprise one or more of the following:
- the constructing method comprises providing the modeled objects, determining, for each respective modeled object, the respective simplicial complex, and storing a relation between each modeled object and its respective simplicial complex;
- determining the respective simplicial complex comprises, for each modeled object, providing the meshing, and determining the image of the couple made of the meshing and the modeled object, by the composition of the parametric view function with the signature function; and/or
- the meshing has vertices, and determining the image of the couple made of the meshing and the modeled object, by the composition of the parametric view function with the signature function comprises, for each vertex of the meshing, evaluating the composition of the parametric view function with the signature function on the modeled object, the parametric view function being parameterized with the value of the parametric domain that corresponds to the vertex.

The constructing method may be executed within a global database search process that also includes one or more instance(s) of the querying method, by one or more users, for example via a computer network. The global process may also include several instances of the constructing method. An initial instance of the constructing method may be executed to create the database, and before any instance(s) of the querying method. Other instances of the constructing method may be performed at any time later, corresponding to addition to the already created database.

It is further provided a computer program comprising instructions for performing the method any one or any combination of the above methods.

It is further provided a data storage medium having recorded thereon the computer program and/or the database.

It is further provided a system comprising a processor coupled to a memory, the memory having recorded thereon the computer program and/or the database.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

Embodiments of the invention will now be described, by way of non-limiting example, and in reference to the accompanying drawings, where:

FIGS. 3-4 show flowcharts of examples of the methods;
FIGS. 7-25 illustrate examples of the methods.

DETAILED DESCRIPTION OF THE INVENTION

Figures 1, 2:
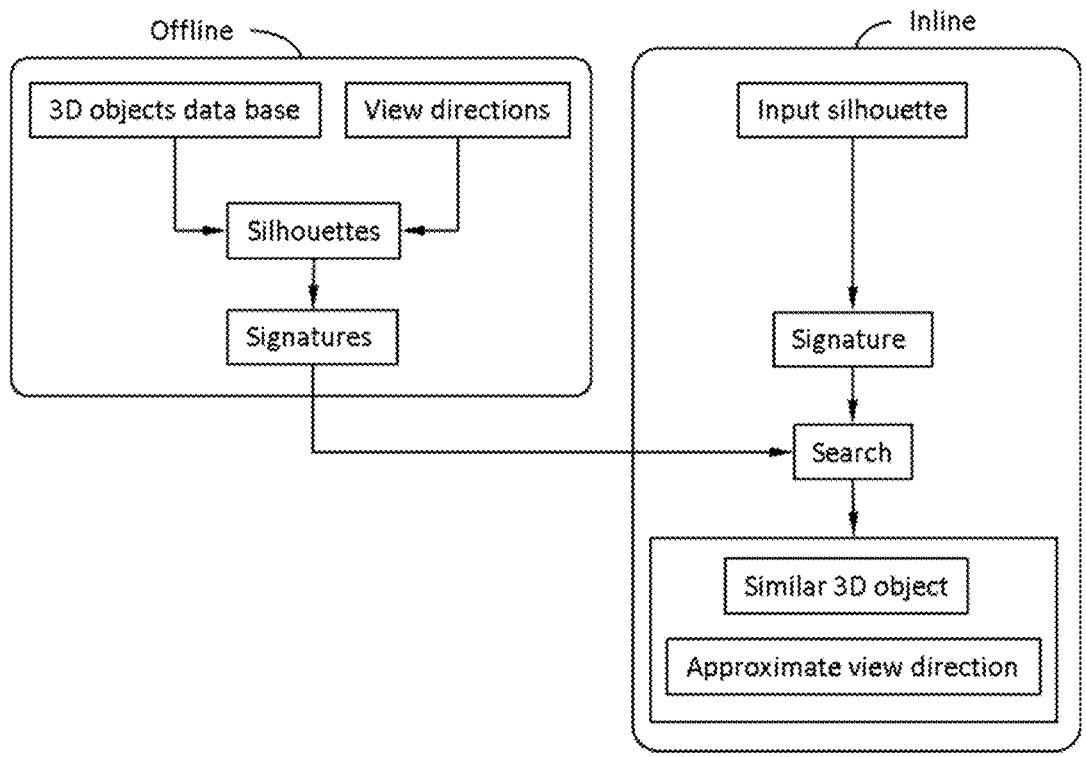
FIGS. 1-2 illustrate the prior art.

A description of example embodiments follows.

With reference to the flowchart of FIG. 3, it is proposed a computer-implemented method for querying a database that comprises modeled objects. Each modeled object represents a physical attribute of a respective real object. The database comprises, for each modeled object, a respective simplicial complex. The respective simplicial complex of a modeled object is the image—by a particular function—of the couple made of a meshing of the parametric domain of a parametric view function and the modeled object. The particular function is the composition of the parametric view function with a signature function, where the parametric view function takes the modeled object as input to provide an output, said output becoming the input of the signature function. The parametric view function is continuous over the parametric domain (i.e. the space containing the parameter values of the parametric view function) and over the modeled object space (i.e. the space containing the modeled objects). The signature function is continuous over the range of the parametric view function (i.e. the space containing the values outputted by the parametric view function). The querying method comprises providing S10 a query that includes a signature criterion. The signature criterion is, by definition, a query (or search) criterion that involves a (i.e. at least one) value of the signature function (i.e. a value outputted by the signature function). The querying method also comprises returning S20, as results of the query, respective modeled objects of the database. A respective modeled object is returned based on an extent to which the respective modeled object has a respective simplicial complex that respects the signature criterion. Such a querying method improves the field of database searching.

With reference to the flowchart of FIG. 4, it is also proposed a computer-implemented method for constructing such a database. The constructing method comprises providing S50 the modeled objects, determining S60, for each respective modeled object, the respective simplicial complex, and storing S70 (in the database) a relation between each modeled object and its respective simplicial complex. The database may be initially created after the first provision S50. The relation is, as known from the field of database engineering, and data that links each simplicial complex to its respective modeled object. In addition to the relation, the database may store as such the simplicial complexes and/or the modeled objects, and/or pointers to the simplicial complexes and/or to the modeled objects. Such a constructing method allows building a database that can be searched in an improved way.

The methods are computer-implemented. This means that steps (or substantially all the steps) of the methods are executed by at least one computer, or any system alike. Thus, steps of the methods are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store the database. The memory is any hardware adapted for such storage, possibly comprising several physical distinct parts (e.g. one for the program, and possibly one for the database).

By "database", it is meant any collection of data (i.e. information) organized for search and retrieval (e.g. a relational database, e.g. based on a predetermined structured language, e.g. SQL). When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

The methods generally manipulate modeled objects. A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

A 3D modeled object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. A 3D modeled object herein may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systemes under the trademark DELMIA®.

By CAE solution, it is additionally meant any solution, software of hardware, adapted for the analysis of the physical behavior of a modeled object. A well-known and widely used CAE technique is the Finite Element Method (FEM) which typically involves a division of a modeled objet into elements which physical behaviors can be computed and simulated through equations. Such CAE solutions are provided by Dassault Systemes under the trademark SIMULIA®. Another growing CAE technique involves the modeling and analysis of complex systems composed a plurality components from different fields of physics without CAD geometry data. CAE solutions allow the simulation and thus the optimization, the improvement and the validation of products to manufacture. Such CAE solutions are provided by Dassault Systemes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systemes under the trademark ENOVIA®.

Figure 5:
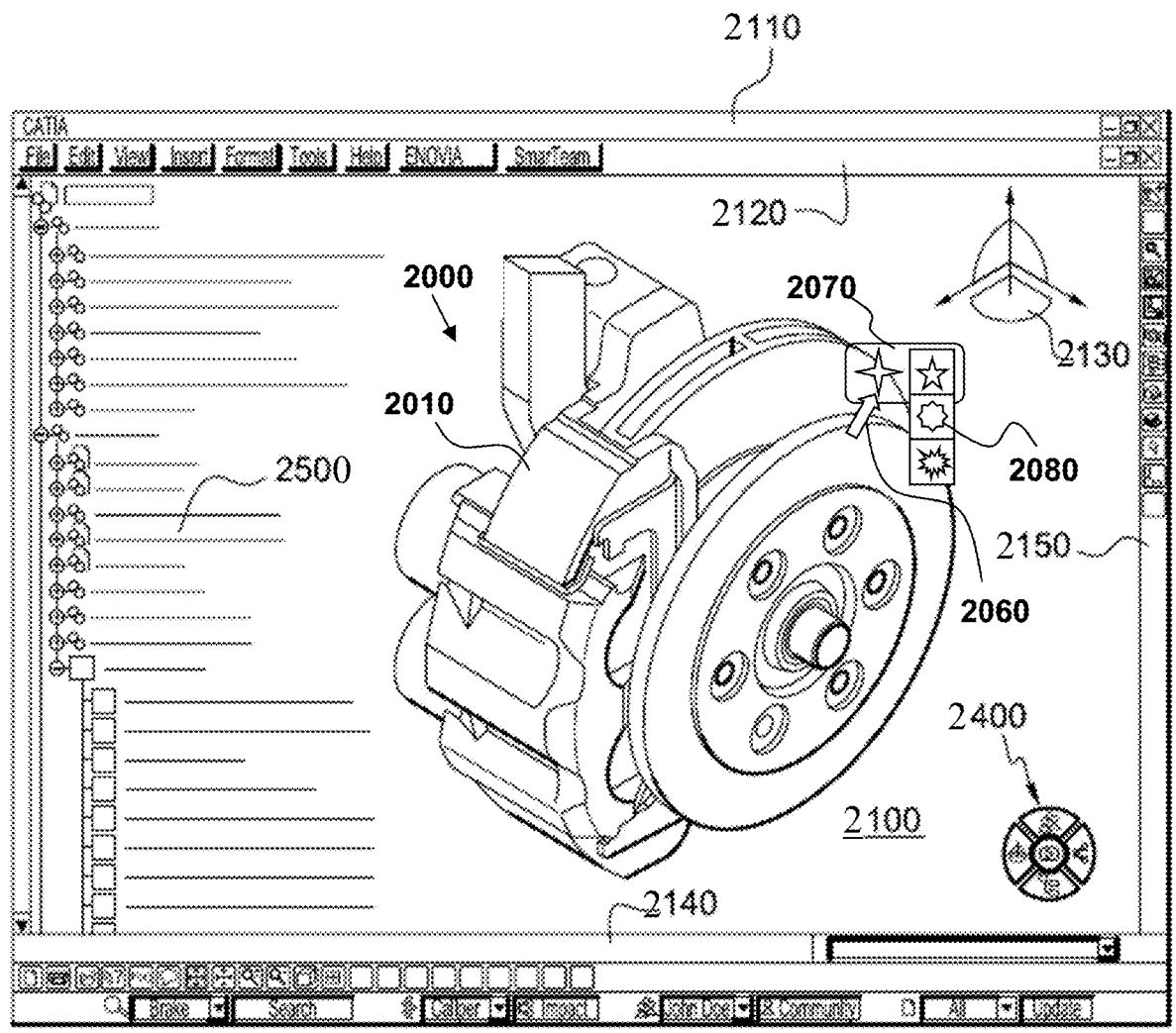
FIG. 5 shows an example of a graphical user interface of the system.

FIG. 5 shows an example of the GUI of the system, wherein the system is a CAD system. The querying method can be launched with such a GUI, based on or resulting in 3D modeled object 2000. The constructing method can also be launched with such a GUI, for example adding the 3D modeled object 2000 to the database.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 6:
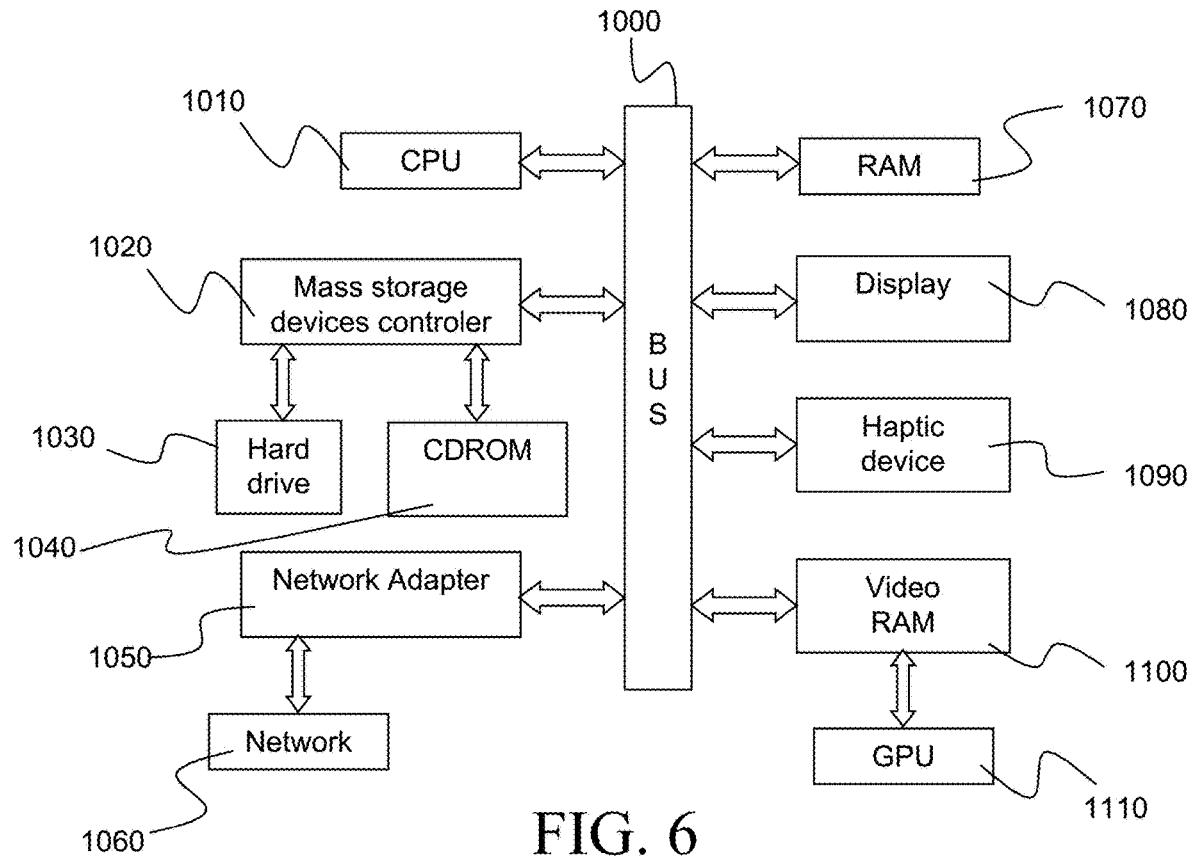
FIG. 6 shows an example of the system.

FIG. 6 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The methods may be part of a process of designing a e.g. 3D modeled object or they may follow such process. "Designing a modeled object" designates any action or series of actions which is at least part of a process of elaborating a modeled object. Thus, a process may comprise creating a first modeled object from scratch (by the user), e.g. via a sketching-like process. Then the process may comprise running (on user command e.g. based on a user-input of the criterion or as an automatic background process e.g. based on a signature of the object being designed) a query according to the querying method. Alternatively, the criterion is directly provided as a value by the user or via a view whose signature value is computed. Then the method may comprise optionally displaying the results to the user and selecting (by the user) a preferred result (in case there is at least one result). Finally the user may continue the design by modifying a result of the query (e.g. the one which has been selected), or by adding a result of the query to the current design. This can thus be useful to help a designer not unnecessarily re-design a model previously designed and re-use such previous design instead. Any other reason to perform a querying method may however be contemplated. For example, the method may be used to find and e.g. delete duplicate (or almost duplicate, that is, very similar) modeled objects from a database (for example in order to reduce the size of the database by eliminating redundancy), or group parts in a same category or based on similarity. In the end of the designing process, the user may add the design to the database, for example by launching the determining, for the designed modeled object, of its respective simplicial complex, and the storing of the relation.

The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

The providing S10 may be performed to a database or to a plug-in/script running on such a database, e.g. at a client computer system or to a server computer system—i.e. database host,—e.g. the client possibly being confounded with the server, which may be the case if they are hosted by the same machine for example. The query includes a criterion (as part of the data that define the query, and e.g. at least as one of the possibly several criteria making the query, e.g. the query possibly including other criteria and optionally weights assigned to the different criteria, as very classical in the field of database search). The querying method also comprises the step of returning S20 (e.g. to the client or at the server), as results of the query (i.e. the returned data including one or more such results or even no/null result—which means that not necessarily several results are returned, the plural form being used as it is the generic expression,—depending on the query and/or on the content of the searched data), respective modeled objects of the database. A respective modeled object is returned based on an extent to which it respects the criterion. The expression "criterion" designates any way to filter and/or rank the modeled objects of the database based only on data of the modeled objects relating to the data involved by the criterion. Querying a database means that a query is run on the database according to the classical meaning of such expression in database engineering, which is that information from the database is extracted from the database as the result of the query (possibly null). In the case of the querying method, modeled objects of the database (that is, any characterizing data thereof) are returned, possibly for user-selection and/or user-triggering of additional data to be downloaded. This is all known per se in the field of database engineering.

In the case of the methods, the query includes at least one criterion that involves at least one value of a signature function (possibly said criterion only), in other words a criterion related to the signature function, for example any search criterion related to one or more values of the signature function, for example an inputted searched modeled object (for which one or more value(s) of the signature function may be computed). That means by definition that an extent to which potential results (at this point, data pieces of the database) match this criterion (the question of handling several criteria, for example with weights in the query, being left aside as this is an implementation detail that can be classically addressed) is evaluated to assess whether or not a piece of information is to be considered as a result or not. Efficient examples of how exactly this extent may be evaluated are provided later. This extent may be binary (a piece of data respects the criterion or not), or it can be progressive (strictly more than two levels of respect, possibly a continuum from a minimal—e.g. 0—value to a maximum value, e.g. 1—e.g. corresponding for example to two equal signature values when the criterion is that results have a signature value equal to the input value). How exactly it is decided that a respective modeled object is a result to be returned or not based on said extent evaluated for said respective modeled object is a matter of implementation.

As each modeled object represents a physical attribute of a respective real object, the methods allow querying at S10 and returning at S20 as results of the query data that represent real object physical attribute. A real object is any object of the real world, such as a unitary physical object or an assembly thereof. A unitary physical object may be a solid, for example a product (such as a—e.g. mechanical—part), a biological object (such as a human, an animal or a plant), an architectural objet (such as a building), a landscape element (such as mountain or a valley). Each real object of the database may thus be such a unitary physical object or assembly of unitary physical objects. Alternatively, the database may include a set consisting of any one or any combination of the following real objects: liquids, gas, and/or waves (e.g. electromagnetic waves, sounds or lights). A physical attribute of a real object is any physical characteristic of the real object, that is, any materialization of a physical phenomenon with respect to the real object. In the case of a real object that is a unitary physical object or an assembly thereof, the physical attribute may be the 3D shape of the real object. In other words, the modeled object represents the 3D shape of the real object. In such case, the modeled object may be a 3D modeled object and/or include data specifying a geometrical surface that represents the boundary of the real object and/or data specifying the geometrical volume that represents the space occupied by the real object. In other examples of a real object that is a unitary physical object or an assembly thereof, the physical attribute may be color distribution, pattern distribution, material distribution. In examples where the real object is a landscape, the physical attribute may be the topography of the landscape. In examples where the real object is an urban scene, the physical attribute may be the architecture of the urban scene. In examples where the real object is a gas, the physical attribute may be particle speed distribution. In examples where the real object is a liquid, the physical attribute may be pressure distribution.

The methods are based on a signature function that does not take as a direct input the modeled object as such, but a view of the modeled object. A signature function is, as known per se, a function that applies on a domain of inputs (the space of modeled object views in the present case) and outputs, in a range called "signature space", data (also called "signature") that allows discrimination between different inputs while consuming less memory than the inputs (e.g. at least twice less memory, for example at least ten times less memory) and/or allowing fast comparisons (e.g. the comparison being a mere distance between two vectors). A signature may be numerical, meaning that the signature is one or a vector of several (e.g. real or integer) number(s). In the case of the methods, the signature function is continuous over the range of the parametric view function, that is over the space of views (reachable by the parametric view function). In such a case, two views that are close one to another lead to two signatures that are also close one to another, allowing relevant comparisons at the time of the returning S20.

A view of a modeled object is a data structure that corresponds to the result of applying a view function to the modeled object. A view function is a data processing that takes the modeled object as an input and outputs data representing the modeled object in a simplified way. By "simplified way", it is meant that the information contained in the view corresponds to a rearrangement of the information contained in the modeled object which is easier to apprehend to a human user and/or where the quantity of information in the view is reduced compared to the quantity of information in the modeled object. For example, a view of a modeled object may be easier to produce than a modeled object itself. This way, the providing S10 can be performed in a relatively simplified way, for example by a user providing one or more input view(s), the system then automatically determining the value(s) of the signature function for the input view(s), said value(s) being then involved in the signature criterion. Also, the size (in terms of memory consumption) of a view of a modeled object may be smaller than the size of the modeled object.

The methods are based on such a view function, which is predetermined and the same for all modeled objects. In addition, the view function is parametric, which means that the view function takes as input not only a modeled object but also parameter values. The space containing the parameter values is called "parametric domain". With such a parametric function, the methods may thus provide for different views of a same modeled object, by varying parameter values. Thus, in case a view implies a loss of information in the initial modeled object, such loss of information accompanying the simplification offered to the user (who can launch the query by providing a view rather than a whole modeled object) can be moderated by the inclusion in the database, for a modeled object, of more than a mere signature function value of a single view. In specific, the database comprises for each modeled object a respective simplicial complex defined on the signature space.

The simplicial complex forms enough information (at least more than a single signature value) for each modeled object to have higher chance to be returned as a result of the query when appropriate. In specific, the respective simplicial complex associated to each modeled object in the database is the image, by the composition of the parametric view function with the signature function, of the couple made of a meshing of the parametric domain and the modeled object. In other words, first it is considered that the parametric domain is meshed (e.g. such meshing may be performed at the time of constructing the database). The meshing is any type of mesh (a mathematical graph structure), for example a triangular or a quad mesh. The meshing covers the parametric domain above a predetermined proportion threshold, for example substantially all the parametric domain. Each meshing may for example cover at least 50% of the parametric domain. The meshing being a structure defined on the parametric domain of the parametric view function, each position of the meshing can be associated to a view of any modeled object. Then, for a given modeled object, the signature function can be applied to a couple (i.e. ordered pair of pieces of data) made of (i.e. consisting of) a position of the meshing (i.e. a position in the parametric domain) and the given modeled object. This amounts, by definition, to applying the signature function to the view of the given modeled object corresponding to said position of the meshing (which position corresponds to a parameterization of the view function). Now, when considering the whole meshing and the same given modeled object, application of the signature function (i.e. its "image") leads to a simplicial complex in the signature space, as known per se from the field of topology. The database stores such a simplicial complex per modeled object. The meshing on which the simplicial complex is based may be the same or different for each modeled object. In examples provided later, the meshing is adapted to each modeled object to increase efficiency of the querying.

At the time of the querying, given a value of the signature function, that is the signature of one view of a modeled object, the database may not store the value as such, but the methods allow returning results based on the simplicial complexes stored in the database. For example, the extent to which a respective modeled object has a respective simplicial complex that respects the signature criterion may depend on a distance between the value of the signature function of the signature criterion and the respective simplicial complex. In other words, proximity between a signature value in the query and simplicial complexes of the database may be assessed. For example, the complex having the smallest distance to the input signature value may be returned. As an example, the distance may be the $L^P$-distance. This is a particularly relevant distance in case the signature space is of the type $\mathbb{R}^m$ where m is an integer. Any other distance relevant to the signature space can be contemplated.

The parametric view function is continuous over the modeled object space, that is, the space corresponding to all values that can be taken by the physical attribute (e.g. a 3D space in the case of 3D modeled object). This basically means that, for a parametrization (i.e. a setting of the parameters) of the view function, two real object physical attribute values close one to another (for example, the physical attribute values of two real objects that are similar with respect to the physical attribute), and therefore two modeled objects close one to another, lead to two view function values close one to another. Also, the view function is continuous over the parametric domain. This means that, for a given modeled object, two parameterizations of the view function closes one to another (i.e. close values for the parameters) lead to two view function values close one to another. As a result, the methods provide for a view-based search that can lead to a relatively relevant result with respect to physical-attribute-wise similarity, in a simple way to operate for the user. Notably, the continuity conditions allow the simplicial complex to convey a relatively accurate representation of the signatures of the modeled object for all views.

The inverse of the above proposition is not necessarily true. In other words, two view function values close one to another do not necessarily lead to two real object physical attribute values close one to another. This can lead to well-known inaccuracies of view-based search, as explained earlier with reference to FIG. 2. By storing, in the database, simplicial complexes and returning at S20 results based on an extent to which simplicial complexes respect the signature criterion (rather than storing a set of different signature function values corresponding to different view function values and searching for the stored signature function that respects the signature criterion the most), the methods decrease occurrence of such inaccuracies, making the methods robust. Furthermore, the simplicial complex representation is simple (e.g. relative to another type of representation, such as a parametric or polynomial representation). This allows keeping the database light in terms of size. Indeed, the method may only consume memory of the order of size of the meshing (for each modeled object).

Therefore, the method lies within the context of searching for modeled objects having parameter-dependent views. The method does not impose to rely on a view-independent signature of the modeled object. The signature function may thus be view-dependent. The method thus does not involve the lack of precision due to such methodology. Furthermore, the method does not require as much memory for the database as a solution that populates the database with the signature value of all views of a same object.

The view function may be a projection of the modeled object. For example, the modeled object represents the physical attribute via a vector of pieces of information (e.g. each piece of information being represented by a corresponding piece of data). The view function may correspond to a projection of the vector, for example on a lower dimension space. In case the modeled objects are 3D modeled objects, the projection may be a geometrical projection. For example, the modeled objects may be 3D modeled objects representing a physical attribute of the real objects and the physical attribute may be the 3D shape of the real objects. In such a case, the view function may be geometrical projection on a 2D space. The view function may be a 2D silhouette function, that is a function that outputs a 2D silhouette (i.e. contour or space occupied by a 2D projection) according to a geometrical view. In such a case, the parametric domain may include geometrical view parameters, for example including position of point of view and/or view direction. Also, in such a case, the signature function may be size-independent, planar translation invariant, and/or planar rotation invariant (i.e. the signature of an input 2D silhouette does not depend on its size and/or positioning but only on its general shape).

For example, the physical attribute is the physical shape (i.e. set of physical locations of the material defined by the real object), and the modeled objects are thus 3D modeled objects, for example CAD files. In such a case, the view function can be for example the 2D silhouette with, as a parametric domain, a domain of view directions. In other words, the 2D silhouette of a 3D modeled object for a given view direction is the projection, along the given view direction, on a 2D plane perpendicular to the projection. The domain of view directions may be provided as a sphere, e.g. a unit sphere. Each position on the sphere defines a respective view direction (and thus a respective parameterization of the view function).

In such cases, the providing S10 may be performed by a user inputting one or more 2D silhouettes representing a real object, for example by sketching such silhouettes. The sketching may be performed with a mouse, or more easily with a touch pen or a finger on a touchpad and/or a sensitive screen. The user may for example draw one or more 2D contours of the real object. For the input 2D silhouette or each input 2D silhouette, the querying method may then automatically compute the signature value based on the predetermined signature function (e.g. the same used in the construction of the database, that is, in the storing of the simplicial complexes). The signature function may be size-independent, planar translation invariant, and/or planar rotation invariant. Such signature value(s) are thus involved in a query criterion (e.g. in any way, for example as values to be found, or as values defining a range, or as value top the which one wants to find the closest modeled object(s), e.g. the case of multiple input signature values being handled in any way). The querying method may then run the query and return at S20 modeled objects based on an extent to which their simplicial complex respects the query criterion based on the inputted view(s).

In such cases and in other cases, the querying method may additionally output not only modeled objects as results, but also the values of the parameters for which they are returned. Indeed, when the extent to which a respective modeled object has a respective simplicial complex that respects the signature criterion is assessed, an optimal (set of) parameter(s) may be determined. Indeed, an optimal position on the simplicial complex may be determined, and an optimal position of the meshing in the parametric domain can be backtracked based on that. Such information can be returned at S20 to the user. For example, in the case of 2D silhouettes views of 3D modeled objects representing 3D shape of real objects, the user may be interested not only on the 3D modeled objects of the database that best match queried 2D silhouettes, but also in the view parameters (e.g. the view direction) for which the returned 3D modeled objects were selected as results.

Examples of the methods which deal with searching an object in a database that is similar to an input object are now discussed with reference to FIGS. 7-25.

An input object is given through a planar image that represents its silhouette according to a view direction. Objects indexed in the database as well as the searching process are based on numerical signatures computed using planar silhouette images and view directions.

Figure 7:
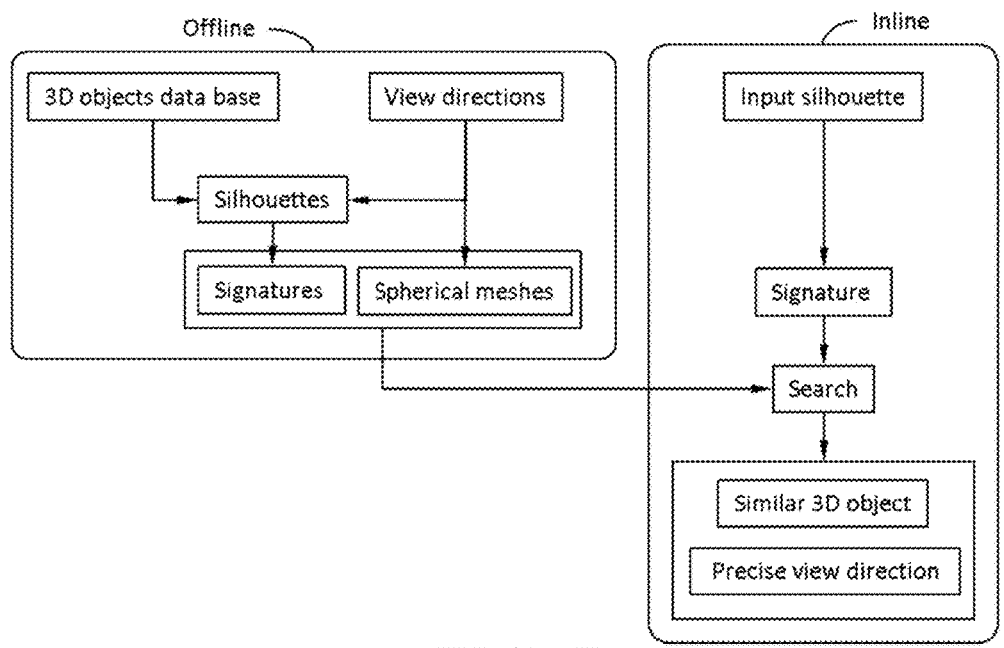

A feature of the examples of the methods is a topological structure onto the numerical signatures associated with the same 3D object. This topology may be a spherical triangular meshing of the view directions. This way, each vertex of the triangular meshing may be the numerical signature of the 3D object associated with a view direction. Each 3D object in the database may be associated with a triangulated meshing in the space of numerical signatures. Triangulated meshes may be computed during the offline process, as illustrated in the diagram of FIG. 7 which shows an example.

The mesh structures associated with 3D objects of the database may be used during the inline process in order to find the similar 3D object. The closest signature from the said meshes to the input signature may be computed. When the closest signature is a vertex, which is an existing signature in the database, the solution may be the same as the one of the state of the art. But when the closest signature is inside a triangle, not only the similar object may be identified, but the precise view direction may be computed by interpolation.

Figure 8:
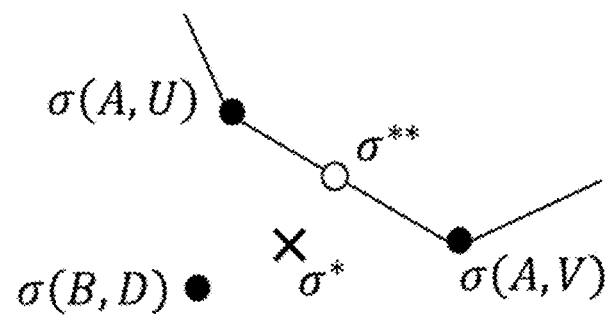

In FIG. 8, $\sigma^{**}$ is the closest signature from the mesh associated with 3D object A to the input signature $\sigma^*$. It is closer to $\sigma^*$ than $\sigma$(B, D), so 3D object A is recognized to be similar to the input. Furthermore, the view direction W is computed by interpolating U and V because $\sigma^{**}$ is on the edge joining $\sigma$(A, U) and $\sigma$(A, V).

The methods of the examples are more accurate than the prior art. The similar object may be more safely recognized, and the view direction may be more precise. If state of the art technology where to attempt increasing its level of precision by increasing the number of view directions, this would result in a larger database and much longer computation times.

The methods make use of simplicial complexes. This widely known topological object is described in details notably in the following book: James R. Munkres, *Elements of algebraic topology*, Addison-Wesley. This mathematical concept provides a unified and general data format and it is recapitulated hereunder for consistency.

Roughly speaking, the simplicial complex generalizes, in any dimension, the usual notion of triangulation. Given an integer number k≥0, named the dimension of the simplex, a k-simplex is the convex hull of k+1 points in an at least k-dimensional ambient space. These k+1 points are called the vertices of the simplex. The k-simplex with vertices $v_0, \ldots, v_k$ is noted $[v_0, \ldots, v_k]$.

By definition of the convex hull, $p \in [v_0, \ldots, v_k]$ if and only if there exist k+1 real numbers $\lambda_i$ such that $p = \Sigma_{i=0}^{k} \lambda_i v_i$ with $\Sigma_{i=0}^{k} \lambda_i = 1$ and $\lambda_i \geq 0$ for all $i \in \{0, \ldots, k\}$.

Figure 9:
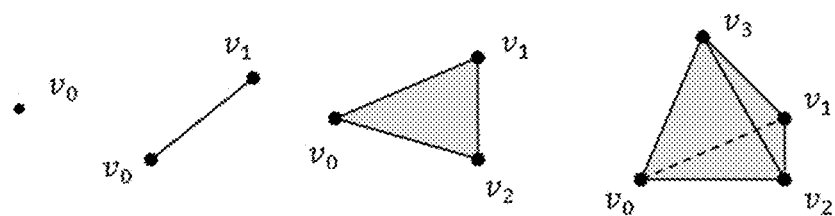

For example, as shown on FIG. 9, a 0-simplex $[v_0]$ is a point (or a vertex), a 1-simplex $[v_0, v_1]$ is a line segment between two distinct points, a 2-simplex $[v_0, v_1, v_2]$ is a triangle spanned by three non collinear points, a 3-simplex $[v_0, v_1, v_2, v_3]$ is a tetrahedron spanned by four non coplanar points, a 4-simplex $[v_0, v_1, v_2, v_3, v_4]$ is spanned by five points which do not fit in any 3-dimensional affine subspace in an at least 4-dimensional space, and so on. The word "simplex" is also used instead of k-simplex when the dimension k is not specified.

Figure 10:
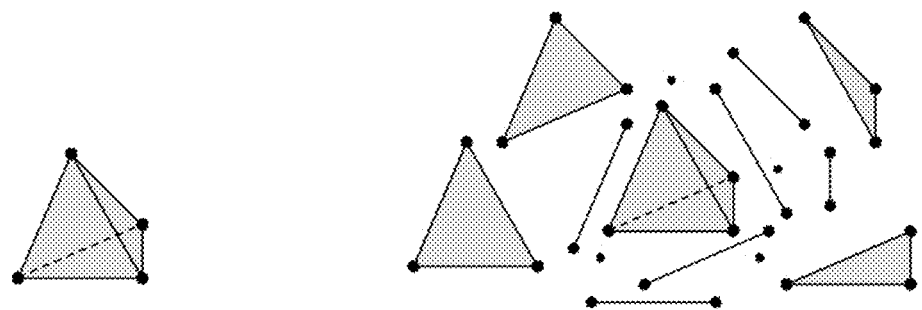

By definition, a face of a k-simplex C is any j-simplex, with j≤k whose vertices are a subset of vertices of C. FIG. 10 illustrates a 3-simplex on the left, and all faces of the 3-simplex on the right. This includes the 3-simplex itself together with triangles, line segments and points.

By definition, a simplicial complex K is a set of simplexes such that:

if a simplex belongs to K all its faces also belong to K,
the intersection of two simplexes in K is either empty, either a face of both.

The second condition means that a simplicial complex does not feature self-intersections. The dimension of a simplicial complex is the maximal dimension of its simplexes. For example, a triangulation is a 2-dimensional simplicial complex. A simplex of a simplicial complex is said to be maximal if it is not the face of another simplex. For example, all triangles of a triangular meshing are maximal simplexes.

From the indexing point of view, noting $\{v_1, v_2, \ldots, v_n\}$ the set of all vertices of a simplicial complex K, each simplex C of K is defined by an injective index mapping $\varphi_C$. Noting dim(C) the dimension of simplex C, this mapping is $\varphi_C: \{0, 1, 2, \ldots, \dim(C)\} \{1, 2, \ldots, n\}$ so that C can be noted $C = [v_{\varphi_C(0)}, v_{\varphi_C(1)}, \ldots, v_{\varphi_C(\dim(C))}]$.

Examples of the Offline process are now discussed.

Let P be a virtual 3D object, typically a solid polyhedron. Let $D_i$, i=1, ..., n be n unit vectors in the three-dimensional space $\mathbb{R}^3$ defining view directions. Noting $S^2$ the unit sphere in $\mathbb{R}^3$, it is equivalent to write $D_i \in S^2$ for i=1, ..., n. Silhouette images $S_i$ of solid P are computed according to each view direction $D_i$, which is noted $S_i = S(P, D_i)$ where S(•) is the silhouette algorithm. By nature, each silhouette image $S_i$ is a planar binary map.

Figure 11:
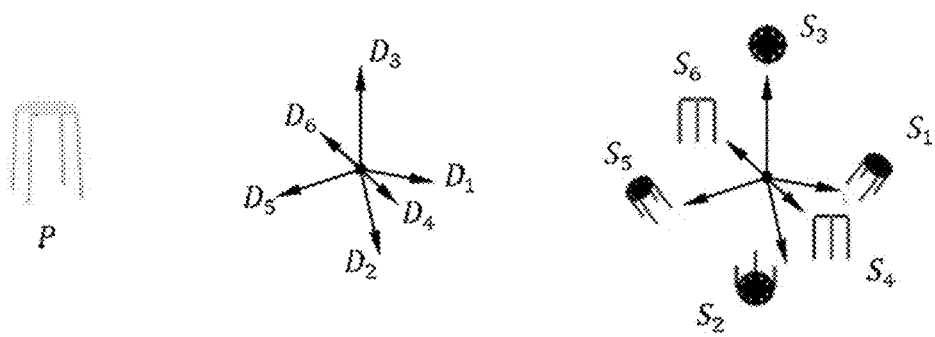

From left to right, FIG. 11 illustrates solid P, view directions $D_i$, i=1, ..., 6 and corresponding silhouette images $S_i$, i=1, ..., 6.

Numerical signatures $\sigma_i$ of images $S_i$ are computed in such a way that $\sigma_i$ is invariant under planar translation and planar rotation of $S_i$. A typical algorithm for this purpose is described in any of the following two papers: Petros Daras, Apostolos Axenopoulos, *A 3D Shape Retrieval Framework Supporting Multimodal Queries*, Int J Comput Vis (2010) 89: 229-247, and Mingqiang Yang, Kidiyo Kpalma, Joseph Ronsin. *A Survey of Shape Feature Extraction Techniques*. Peng-Yeng Yin. Pattern Recognition, IN-TECH, pp. 43-90, 2008. Notation is $\sigma_i = \sigma(S_i)$ where $\sigma(\cdot)$ is the signature algorithm. Each signature $\sigma_i$ is a vector made of m real numbers, and is interpreted as a point in the finite dimensional space $\mathbb{R}^m$. Consequently, the numerical signature of solid P is made of n points in $\mathbb{R}^m$ and is noted $(\sigma_1, \ldots, \sigma_n) \in (\mathbb{R}^m)^n$.

Figure 12:
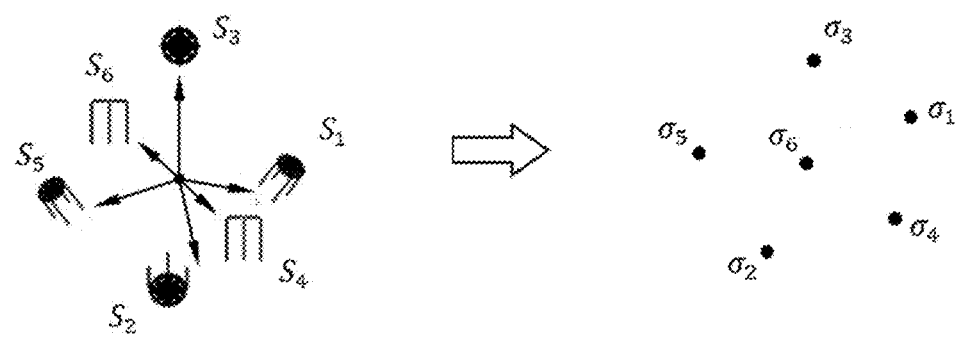

FIG. 12 illustrates the numerical silhouette signatures $\sigma_1, \ldots, \sigma_6$ computed from the silhouette images $S_1, \ldots, S_6$. Notice that $\sigma_1, \ldots, \sigma_6$ should be interpreted in a m-dimensional space.

A feature of the examples is a topology associated with the n-tuple $(\sigma_1, \ldots, \sigma_n)$ of numerical signatures. It is defined as follows. The n view directions $D_i$ are as many points on the sphere $S^2$ in $\mathbb{R}^3$. Let M be a spherical triangular meshing of points $D_i$, i=1, ..., n.

Figure 13:
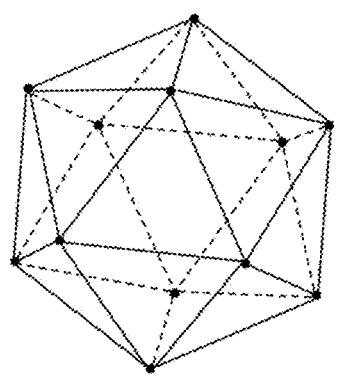

A typical meshing is the convex hull of points $D_i$. It can be also the icosahedron, as illustrated in FIG. 13, which supports twelve view directions.

The topology of M is captured according to the simplicial complex format. Vertices are $\{D_1, D_2, \ldots, D_n\}$. Each triangle T is a 2-simplex defined through its index mapping $\varphi_T: \{0, 1, 2\} \rightarrow \{1, 2, \ldots, n\}$ by $T = [D_{\varphi_T(0)}, D_{\varphi_T(1)}, D_{\varphi_T(2)}]$. Each line segment L is a 1-simplex defined through its index mapping $\varphi_L: \{0, 1\} \rightarrow \{1, 2, \ldots, n\}$ by $T = [D_{\varphi_L(0)}, D_{\varphi_L(1)}]$.

Figure 14:
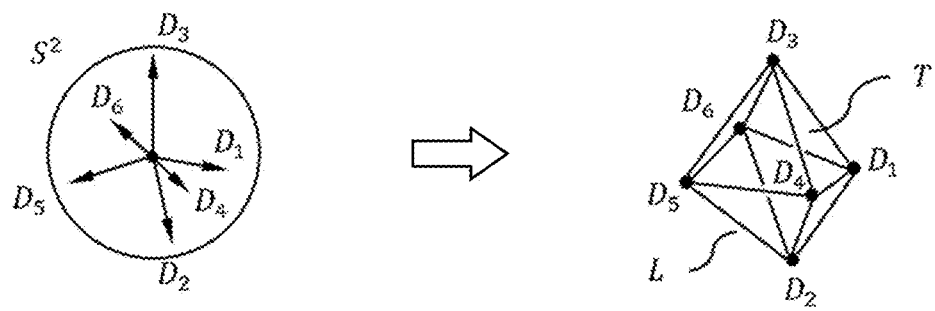

FIG. 14 illustrates the spherical meshing (right drawing) of six view directions (left drawing). For example, the index mapping of triangle T is $\varphi_T(0)=1$, $\varphi_T(1)=3$ and $\varphi_T(2)=4$; the index mapping of line segment L is $\varphi_L(0)=2$ and $\varphi_L(1)=5$.

The embedding of meshing M into the space $\mathbb{R}^m$ of numerical signatures is noted $\Sigma$. It is obtained by using the same indexing structure and by replacing each view direction $D_i$ by its corresponding signature $\sigma_i = \sigma(S(D_i, P))$.

Figure 15:
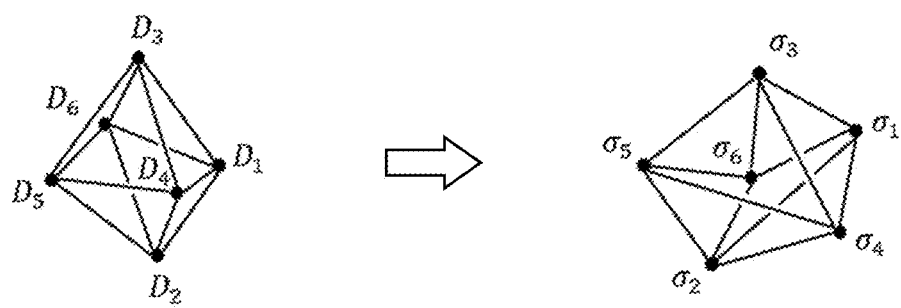

FIG. 15 illustrates the embedding. Left drawing is the spherical meshing M of sphere $S^2$ in $\mathbb{R}^3$ and right drawing is $\Sigma$ in $\mathbb{R}^m$.

Finally, the topological signature of solid P is defined by $\Sigma$, and noted $\Sigma(P)$, which is a triangulated mesh in $\mathbb{R}^m$. It must be understood that the shape of $\Sigma(P)$ in $\mathbb{R}^m$ can be twisted or folded, depending on the coordinates of vertices $\sigma_i$. In particular, $\Sigma(P)$ does not necessarily save the convexity of the spherical meshing in $\mathbb{R}^3$ and can feature degenerate simplexes.

The value of the topology with respect to the relevancy of the results returned at S20 is now discussed.

As explained previously, the spherical meshing of the view directions provides the topology of the signatures $\Sigma(P)$ in space $\mathbb{R}^m$. It is important to understand that there is no way to retrieve the topology by merely investigating the finite set of signatures $\{\sigma_1, \ldots, \sigma_n\} \subset \mathbb{R}^m$. Illustration is made with a 2D set of view directions (the unit circle) and a 2D signature space.

Figure 16:
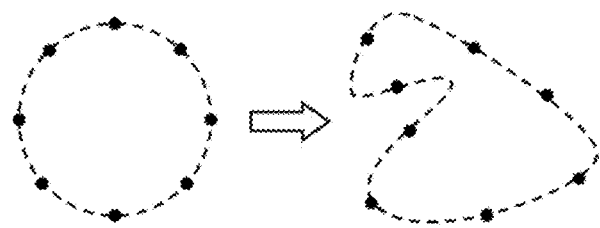

FIG. 16 illustrates the precise topology of the view directions (dotted unit circle) and the precise (and unknown) topology of the signatures (dotted closed folded curve).

FIG. 17 illustrates a sampling of the view directions (left drawing), the corresponding signatures (center drawing) and the boundary of the convex hull of the signatures (right drawing), as a candidate to create a topology on the finite set of signatures. Clearly, the topology suggested by the convex hull is not appropriate because two signatures are not involved.

FIG. 18 illustrates the topology of the signatures (right drawing) induced by meshing the view directions sampling (left drawing) and through the transportation in the signature space. Notice that, as opposed to previous figure, all signatures are involved. Furthermore, as it is discussed later, a dense sampling of the view directions space provides a dense sampling of the signature surface.

An optional Offline process improvement that consists in eliminating degenerate simplexes is now discussed. As a result of this elimination, each respective simplicial complex in the database only has non-degenerated simplexes.

For this reason, a preprocessing eliminates degenerate simplexes from $\Sigma(P)$ so that the database and further geometrical algorithms are safer. The degeneracy diagnosis may be as follows.

For each simplex $C = [v_{\varphi_C(0)}, \ldots, v_{\varphi_C(dim(C))}]$ of simplicial complex K, consider matrix:

$$M(C) = [v_{\varphi_C(1)} - v_{\varphi_C(0)} \cdots v_{\varphi_C(dim(C))} - v_{\varphi_C(0)}]$$

Matrix M(C) features dim(C) columns and m rows. If the rank of matrix M(C) is equal to dim(C), then the simplex C is non-degenerate. Otherwise, it is degenerate and removed from K. It must be understood that removing simplex C does not remove vertices. Furthermore, the resulting simplicial complex may feature self-intersection, but experience shows that they do not affect the computation.

FIGS. 19-20 illustrate a degenerated situation. FIG. 19 is a regular triangulation K described as a 2-dimensional simplicial complex. 0D simplexes are 7 vertices $v_1, \ldots, v_7$, 1D simplexes are 12 line segments $L_1 = [v_3, v_1]$, $L_2 = [v_1, v_2]$, etc. and 2D simplexes are 6 triangles $T_1 = [v_3, v_4, v_1]$, $T_2 = [v_4, v_2, v_1]$, $T_3 = [v_4, v_5, v_2]$, $T_4 = [v_6, v_4, v_3]$, $T_5 = [v_6, v_7, v_4]$, $T_6 = [v_7, v_5, v_4]$. FIG. 20 is triangulation K' obtained from K by moving vertex $v_4$ onto the edge $[v_5, v_7]$. This changes triangle $T_6$ into a degenerate triangle because vectors $v_5$-$v_7$ and $v_4$-$v_7$ are collinear making the image of matrix $M(T_6) = [v_5$-$v_7 \;\; v_4$-$v_7]$ a one dimensional space. Consequently, the preprocessing eliminates triangle $T_6$ from K' description, which now consists in 5 triangles, 12 edges and 7 vertices. The self-intersection in K' is that vertex $v_4$ belongs to line segment $[v_5, v_7]$, which is not captured by a topological relationship. In this example, the non-self-intersecting complex would be obtained by removing simplex $[v_5, v_7]$ as well, but it is not worthwhile.

Another optional Offline process improvement that consists in local refinement of the signature surface is now discussed. As a result of this local refinement, each respective meshing $M(D_i \in S^2; i=1, \ldots, n)$ of the parametric domain $S^2$ of the parametric view function $S_P$ respects a precision criterion in the range $\mathbb{R}^m$ of the signature function $\sigma(\bullet)$.

Consider the mapping $\Delta_P: S^2 \to \mathbb{R}^m$ associated with solid P and defined on the unit sphere $S^2 \subset \mathbb{R}^3$ by the numerical signature of the silhouette image of solid P according to view direction D, that is $\Delta_P(D) = \sigma(S(P, D))$.

Now, consider the set of all $\Delta_P(D)$ for all $D \in S^2$ and noted $\Sigma^*(P) = \{\Delta_P(D), D \in S^2\}$. It can be proven that mapping $\Delta_P$ is continuous. This is explained for example in the following paper: Petros Daras, Apostolos Axenopoulos, *A 3D Shape Retrieval Framework Supporting Multimodal Queries*, Int J Comput Vis (2010) 89: 229-247. This makes $\Sigma^*(P)$ a continuous 2D surface of $\mathbb{R}^m$, named the signature surface.

By construction, $\Sigma(P)$ is a triangular interpolation of the theoretical signature surface $\Sigma^*(P)$. By using a refinement process (described in the following) it is possible to add vertices and triangles to $\Sigma(P)$ in order to reach a sag criterion, making $\Sigma(P)$ a better interpolation of $\Sigma^*(P)$. This property may be used during the offline process in order to build a precision driven database of signatures.

The refinement process may be used in the examples as follows. Given a precision threshold $\varepsilon > 0$ and a solid P, each edge of $\Sigma(P)$ is visited and its middle point is tested against the precision. If the precision is not reached, a new vertex and adjacent triangles are created.

| | |
|---|---|
| 01 | For each solid P in the database do begin |
| 02 | While exists an unvisited edge of the mesh $\Sigma(P)$ do begin |
| 03 | Let e be an unvisited edge. |
| 04 | Let U, V be the view directions associated with vertices of edge e. |
| 05 | $s := \left\| \sigma\left(S\left(P, \dfrac{U+V}{\|U+V\|_{\mathbb{R}^3}}\right)\right) - \dfrac{1}{2}(\sigma(S(P, U)) + \sigma(S(P, V))) \right\|_{\mathbb{R}^m}$ |
| 06 | If $s > \varepsilon$ then |
| 07 | Subdivide edge e |
| 08 | Else |

| | |
|---|---|
| 09 | Edge e is labelled "visited" |
| 10 | End if |
| 11 | End while |
| 12 | End for |

Number s computed at step 05 is the distance between the average signature ½(σ(S(P, U))+σ(S(P, V))) and the signature of image of solid P according to the average view direction $$\frac{U+V}{\|U+V\|_{\mathbb{R}^3}}.$$

In other words, it is the distance between the middle point of e and Σ*(P).

Figure 21:
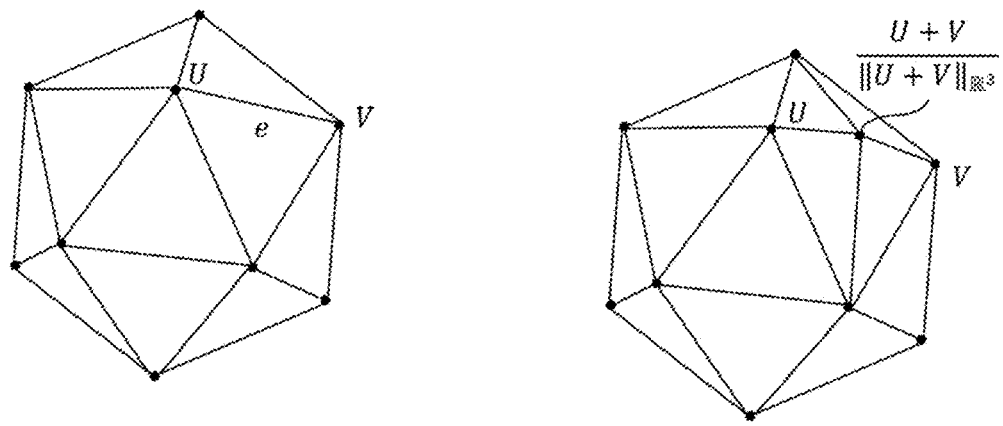
Figure 22:
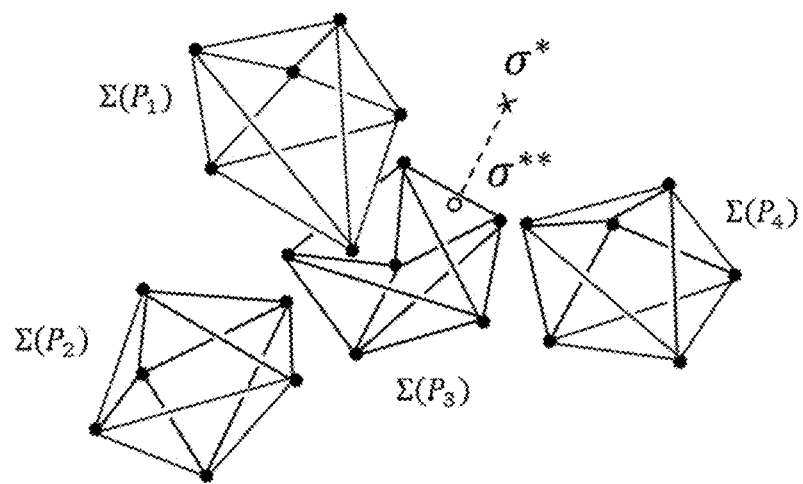

The "subdivide" procedure of step 07 may be to create a new view direction in the middle point of the edge together with adjacent triangles, as illustrated by FIG. 21 in the $\mathbb{R}^m$ space.

Examples of the inline process are now discussed.

Let Σ($P_i$), i=1, ..., N be the topological signatures of all 3D objects $P_i$, i=1, ..., N in the database. Given σ*∈$\mathbb{R}^m$ the input silhouette numerical signature, the searching process is to find the closest point σ among all topological signatures Σ($P_i$) for i=1, ..., N. By nature, σ belongs to particular Σ($P_j$), meaning that solid $P_j$ is similar to the input. In addition, the view direction D is computed. This is illustrated on FIG. 22.

The overall algorithm of the inline process may run as follows. The main method is SimSol(σ*, P, D) meaning "similar solid". Inputs may be the database of solids (and their respective topological signatures) and the silhouette signature σ*. Outputs may be the similar solid P and the view direction D. It makes use of method DC(•) that computes the distance (for example $L^p$-distance) from the input signature to a simplicial complex. This method makes use of method DS(•) that computes the distance to a simplex by using method BC(•) that computes barycentric coordinates. All methods are detailed in the following.

The diagram of FIG. 23 captures the calling sequence.

```
SimSol(σ*, P, D)
d := +∞
For i := 1 to N do begin
    DC (σ-*, E (Pi), B, p., d')
    If d' <d then
        d := d'
        C := B
        λ := μ
        P := P_i
    End if
End for
```

$$D := \frac{\sum_{i=0}^{dim(C)} \lambda_i D_{\phi_{C(i)}}}{\left\|\sum_{i=0}^{dim(C)} \lambda_i D_{\phi_{C(i)}}\right\|_{\mathbb{R}^3}}$$

After the "for" loop in previous algorithm, the closest signature σ** to σ* belongs to simplex C=[$v_{\phi_{C(0)}}$, ..., $v_{\phi_{C(dim(C))}}$] of simplicial complex Σ(P). Furthermore, its barycentric coordinates (explained in the following) are λ=($λ_0$, ..., $λ_{dim(C)}$) on simplex C, so it can be computed:

$$\sigma^{**} = \sum_{i=0}^{dim(C)} \lambda_i v_{\phi_{C(i)}}$$

The corresponding view direction D may be obtained by interpolating view directions $D_{\phi_{C(i)}}$ associated with vertices of simplex C, that is:

$$D = \frac{\sum_{i=0}^{dim(C)} \lambda_i D_{\phi_{C(i)}}}{\left\|\sum_{i=0}^{dim(C)} \lambda_i D_{\phi_{C(i)}}\right\|_{\mathbb{R}^3}}$$

Examples of the determination of the closest point to a simplicial complex are now discussed.

The present discussion only deals with geometry, so the word "point" is preferred to "signature" for clarity.

The input of the algorithm may be a point p in space $\mathbb{R}^m$ and a simplicial complex K in space $\mathbb{R}^m$. The outputs may be the closest simplex C of K from p, the barycentric coordinates λ of the closest point on C and the distance d between p and K. The method is DC(p, K, C, λ, d) for Distance to Complex. It may make use of methods BC(p, C, λ, d) for barycentric coordinates computation and DS(p, C, E, λ, d) for distance to simplex computation.

Barycentric coordinates are now discussed.

Noting k=dim(C), consider the k-simplex C=[$v_{\phi(0)}$, ..., $v_{\phi(k)}$] of K. The method BC(p, C, λ, d) computes the barycentric coordinates λ=($λ_0$, ..., $λ_k$)∈$\mathbb{R}^{k+1}$ of the closest point q to point p that belongs to the affine subspace of $\mathbb{R}^m$ generated by points $v_{\phi(0)}$, ..., $v_{\phi(k)}$.

By definition, barycentric coordinates are such that q=$\sum_{i=0}^{k} \lambda_i v_{\phi(i)}$ and $\sum_{i=0}^{k} \lambda_i$=1. Choosing $λ_0$=1-$\sum_{i=1}^{k} \lambda_i$, point q is written:

$$q(\lambda_1, \ldots, \lambda_k) = v_{\phi(0)} + \sum_{i=1}^{k} \lambda_i (v_{\phi(i)} - v_{\phi(0)})$$

It features the shortest distance to point p so $λ_1$, ..., $λ_k$ are such that:

$$\min_{(\lambda_1, \ldots, \lambda_k)} \frac{1}{2} \|p - q(\lambda_1, \ldots, \lambda_k)\|_{\mathbb{R}^m}^2$$

Consequently, the optimum λ is characterized by $$\frac{\partial}{\partial \lambda_i} \left( \frac{1}{2} \|p - q(\lambda_1, \ldots, \lambda_k)\|^2 \right) = 0$$

for all i=1, ..., k. Classically, this leads to the linear system $$E\begin{pmatrix} \lambda_1 \\ \vdots \\ \lambda_k \end{pmatrix} = F$$

with matrix $$E = (E_{ij})_{i,j=1,\ldots,k}$$

such that $E_{ij} = \langle v_{\varphi(i)} - v_{\varphi(0)}, v_{\varphi(j)} - v_{\varphi(0)} \rangle$ and with vector $$F = \begin{pmatrix} F_1 \\ \vdots \\ F_k \end{pmatrix}$$

such that $F_i = \langle p - v_{\varphi(0)}, v_{\varphi(i)} - v_{\varphi(0)} \rangle$. Matrix E is invertible because simplex C is non degenerated, so optimal $\lambda_1, \ldots, \lambda_k$ are computed with $$\begin{pmatrix} \lambda_1 \\ \vdots \\ \lambda_k \end{pmatrix} = E^{-1} F,$$

and then $\lambda_0 = 1 - \Sigma_{i=1}^{k} \lambda_i$. At the end of method BC(p, C, λ, d), the closest point is $q(\lambda_1, \ldots, \lambda_k)$ and the output distance is $d = \|p - q(\lambda_1, \ldots, \lambda_k)\| \mathbb{R}^m$.

Closest point to a simplex is now discussed.

Method DS(p, C, E, λ, d) iteratively computes the closest point from the input simplex $C = [v_{\varphi_C(0)}, \ldots, v_{\varphi_C(dim(C))}]$ to the input point p by using barycentric coordinates. Outputs are a face E of C, barycentric coordinates λ of the closest point, and distance d from C to p. Of course, barycentric coordinates λ are given on face E, so the closest point q is:

$$q = \sum_{i=0}^{dim(E)} \lambda_i v_{\varphi_E(i)}$$

By definition of the convex hull, point q belongs to the simplex if and only if $\lambda_i \geq 0$ for all $i \in \{0, \ldots, dim(C)\}$.

A unique LIFO list may be used through standard instruction Push(•), Pop(•) and Size. Instruction Push(C) adds object C on top of the list and increments its size. Instruction Pop(C) yields the last object of the list, noted C, removes it from the list and decrements its size. Expression $X - [v_{\varphi_X(i)}]$ in next algorithm defines the simplex Y of dimension dim(Y)=dim(X)−1 by removing vertex $v_{\varphi_X(i)}$ from the definition of simplex X. The indexing of simplex Y is Y= $[v_{\varphi_Y(0)}, \ldots, v_{\varphi_Y(dim(Y))}]$ with $\varphi_Y: \{0, \ldots, dim(Y)\} \to \{1, \ldots, n\}$ such that $\varphi_Y(j) = \varphi_X(j)$ if j<i and $\varphi_Y(j) = \varphi_X(j+1)$ if j≥i.

```
DS(p, C, E, λ, d)
    d := +∞
    Push(C)
```

-continued

```
While Size ≠ 0 do begin
    Pop(X)
    BC(p, X, μ, d')
    If μ_i ≥ 0 for all i ∈ {0, ... , dim(X)} then
        If d' < d then
            E := X
            λ := μ
            d := d'
        End if
    Else
        For i := 0 to dim(X) do begin
            If μ_i < 0 then
                Push(X − [v_{φ_X(i)}])
            End if
        End for
    End if
End while
```

FIG. 24 illustrates the computation of the closest point from triangle $T=[v_0, v_1, v_2]$ to point p. The input simplex $[v_0, v_1, v_2]$ is pushed in the list. After getting $[v_0, v_1, v_2]$ from the list, point p may firstly be projected on plane U generated by points $v_0, v_1, v_2$. This yields point $p_1 = \mu_0 v_0 + \mu_1 v_1 + \mu_2 v_2$ with $\mu_0 < 0$, $\mu_1 > 0$ and $\mu_2 > 0$. Since $\mu_0 < 0$, simplex $[v_1, v_2]$ is pushed in the list. After getting $[v_1, v_2]$ from the list, point p may be projected on line V generated by $v_1, v_2$. This yields point $p_2 = \mu_0 v_1 + \mu_1 v_2$ with $\mu_0 > 0$ and $\mu_1 > 0$. So, $E := [v_1, v_2]$ and $\lambda := (\mu_0, \mu_1)$. The list is now empty and the iteration is ended. Finally, the barycentric coordinates of the closest point of triangle T to point p are $\lambda = (\mu_0, \mu_1)$ in face $[v_1, v_2]$.

Final determination of the closest point to a complex of the examples is now discussed.

Finally, method DC(p, K, C, d) computes the closest point from complex K to point p by using method DS(•). The outputs are the closest simplex C to point p, the barycentric coordinates A of the closest point on C and the distance d between p and K.

DC(p, K, C, λ, d)
d := +∞
For each maximal simplex $B = [v_{\varphi_B(0)}, \ldots, v_{\varphi_B(dim(B))}]$ of complex K do begin

```
DS(p, B, E, μ, d')
    If d' < d then
        d := d'
        C := E
        λ := μ
    End if
End for
```

Examples of the method have been discussed with reference to FIGS. 6-24. But different generalizations can be contemplated. A non-limiting list of examples of generalization is now discussed.

Generalization of the view direction can be contemplated.

So far, the view direction in the examples was defined by a normalized vector, meaning that the silhouette image of the solid is computed according to a parallel view. Dealing with an observer at a finite distance from the solid is to consider the couple (D, r) made of a normalized vector D and a positive number r respectively the view direction and the distance to the solid. Such an extended view direction is named a perspective view, as opposed to the parallel view defined by D only. The set of all perspective views is the Cartesian product $S^2 \times [a, b]$ where a and b are respectively the smallest and largest distances of the observer from the solid. It is a family of spheres centered at the origin of a reference axis system of the solid, as illustrated in FIG. 25.

The Cartesian product $S^2 \times [a, b]$ can be approximated with a (three-dimensional) tetrahedral meshing and previous algorithms can be reused.

Other generalizations can be considered by using more parameters: light source position, and/or light intensity.

Generalization of the silhouette signature can also be contemplated.

So far, the numerical signature is defined by using the 2D silhouette of the solid. It can be generalized to any numerical signature, for example provided it is invariant under isometric transformations and/or similitudes.

A generic framework can also be contemplated.

In fact, the examples can be generalized to a generic parameterized signature framework. The input mathematical entities are: a set $\mathcal{P}$ of objects and a parameterized signature mapping $\sigma: \mathcal{P} \times \mathcal{L} \rightarrow \mathbb{R}^m$. The parameters space $\mathcal{L}$ is a sub-manifold of a finite dimensional space $\mathbb{R}^n$. Mapping $\sigma$ computes vector $\sigma(p, \lambda) \in \mathbb{R}^m$ for all object-parameter couples $(p, \lambda) \in \mathcal{L} \times \mathbb{R}$.

The problem is: given $\sigma^* \in \mathcal{P}$, find the couple $(p, \lambda) \in \mathcal{P} \times \mathcal{L}$ such that $\sigma(p, \lambda)$ is as close as possible to $\sigma^*$.

Firstly, the solution framework is to approximate $\mathcal{L}$ by a simplicial complex $K(\lambda_1, \ldots, \lambda_q)$ in $\mathbb{R}^n$ and to populate the database with simplicial complexes $K(\sigma(p, \lambda_1), \ldots, \sigma(p, \lambda_q))$ for all $p \in \mathcal{P}$, possibly using local refinement. Secondly, the solution is to compute distances between simplicial complexes and points in order to find $(p, \lambda)$ closest to $\sigma^*$.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

The invention claimed is:

1. A computer-implemented method for querying a database of modeled objects, comprising:
   obtaining access to a database storing modeled objects,
   each modeled object representing a physical attribute of a respective real object,
   the database comprising, for each modeled object, a respective simplicial complex, the respective simplicial complex of a modeled object being a set of simplexes, a simplex being a convex hull of a plurality of points and the respective simplicial complex of a modeled object being an image of a couple made of a meshing of a parametric domain of a parametric view function and the modeled object, by composition of the parametric view function with a signature function,
   the parametric view function being continuous over the parametric domain and over a space of the modeled object,
   the signature function being continuous over a range of the parametric view function;
   providing a query that includes a signature criterion that involves a value of the signature function; and
   returning, as results of the query, respective modeled objects of the database, a respective modeled object being returned based on an extent to which the respective modeled object has a respective simplicial complex that respects the signature criterion.

2. The method of claim 1, wherein the extent to which a respective modeled object has a respective simplicial complex that respects the signature criterion depends on a distance between the value of the signature function of the signature criterion and the respective simplicial complex in a range of the signature function.

3. The method of claim 1, wherein each respective meshing of the parametric domain of the parametric view function respects a precision criterion in a range of the signature function.

4. The method of claim 1, wherein each respective simplicial complex only has non-degenerated simplexes.

5. The method of claim 1, wherein the physical attribute is the 3D shape, the modeled objects being 3D modeled objects, and the parametric view function is a 2D silhouette function, the parametric domain being a domain of geometrical view parameters.

6. The method of claim 5, wherein the domain of geometrical view parameters includes a domain of geometrical view directions.

7. A non-transitory computer readable medium comprising:
   a memory area having stored thereon a database that comprises modeled objects,
   each modeled object representing a physical attribute of a respective real object,
   the database comprising, for each modeled object, a respective simplicial complex, the respective simplicial complex of a modeled object being a set of simplexes, a simplex being a convex hull of a plurality of points and the respective simplicial complex of a modeled object being an image of a couple made of a meshing of a parametric domain of a parametric view function and the modeled object, by composition of the parametric view function with a signature function,
   the parametric view function being continuous over the parametric domain and over a space of the modeled object, and
   the signature function being continuous over a range of the parametric view function.

8. A computer-implemented method for constructing a database that stores modeled objects, the method comprising:
   receiving each modeled object representing a physical attribute of a respective real object; and
   configuring the database to comprise, for each modeled object, a respective simplicial complex, the respective simplicial complex of a modeled object being a set of simplexes, a simplex being a convex hull of a plurality of points and the respective simplicial complex of a modeled object being an image of a couple made of a meshing of a parametric domain of a parametric view function and the modeled object, by composition of the parametric view function with a signature function,
   the parametric view function being continuous over the parametric domain and over a space of the modeled object, and
   the signature function being continuous over a range of the parametric view function.

9. The method of claim 8, wherein the method further comprises:
   providing the modeled objects;
   determining, for each respective modeled object, the respective simplicial complex; and
   storing a relation between each modeled object and its respective simplicial complex.

10. The method of claim 9, wherein determining the respective simplicial complex comprises, for each modeled object:

providing the meshing, and determining the image of the couple made of the meshing and the modeled object, by the composition of the parametric view function with the signature function.

11. The method of claim 10, wherein the meshing has vertices, and determining the image of the couple made of the meshing and the modeled object, by the composition of the parametric view function with the signature function comprises, for each vertex of the meshing:

evaluating the composition of the parametric view function with the signature function on the modeled object, the parametric view function being parameterized with a value of the parametric domain that corresponds to the vertex.

12. A non-transitory computer readable medium comprising:

a memory area having recorded thereon a computer program comprising instructions for querying a database storing modeled objects, each modeled object representing a physical attribute of a respective real object, the database comprising, for each modeled object, a respective simplicial complex, the respective simplicial complex of a modeled object being a set of simplexes, a simplex being a convex hull of a plurality of points and the respective simplicial complex of a modeled object being an image of a couple made of a meshing of a parametric domain of a parametric view function and the modeled object, by composition of the parametric view function with a signature function, the parametric view function being continuous over the parametric domain and over a space of the modeled object, the signature function being continuous over a range of the parametric view function, the computer program instructions including instructions to:

provide a query that includes a signature criterion that involves a value of the signature function; and return, as results of the query, respective modeled objects of the database, a respective modeled object being returned based on an extent to which the respective modeled object has a respective simplicial complex that respects the signature criterion.

13. A non-transitory computer readable medium comprising:

a memory area having recorded thereon a computer program comprising instructions for constructing a database that stores modeled objects, each modeled object representing a physical attribute of a respective real object, the database comprising, for each modeled object, a respective simplicial complex, the respective simplicial complex of a modeled object being a set of simplexes, a simplex being a convex hull of a plurality of points and the respective simplicial complex of a modeled object being an image of a couple made of a meshing of a parametric domain of a parametric view function and the modeled object, by composition of the parametric view function with a signature function, the parametric view function being continuous over the parametric domain and over a space of the modeled object, and the signature function being continuous over a range of the parametric view function.

14. A computer-based system comprising:

a processor coupled to a memory, the memory having recorded thereon computer executable instructions querying a database that stores modeled objects, each modeled object representing a physical attribute of a respective real object, the database comprising, for each modeled object, a respective simplicial complex, the respective simplicial complex of a modeled object being a set of simplexes, a simplex being a convex hull of a plurality of points and the respective simplicial complex of a modeled object being an image of a couple made of a meshing of a parametric domain of a parametric view function and the modeled object, by composition of the parametric view function with a signature function, the parametric view function being continuous over the parametric domain and over a space of the modeled object, the signature function being continuous over a range of the parametric view function, the computer executable instructions including instructions:

providing a query that includes a signature criterion that involves a value of the signature function; and returning, as results of the query, respective modeled objects of the database, a respective modeled object being returned based on an extent to which the respective modeled object has a respective simplicial complex that respects the signature criterion.

15. A computer-based system comprising:

a processor coupled to a memory, the memory having recorded thereon computer executable instructions constructing a database that comprises modeled objects, each modeled object representing a physical attribute of a respective real object, the database comprising, for each modeled object, a respective simplicial complex, the respective simplicial complex of a modeled object being a set of simplexes, a simplex being a convex hull of a plurality of points and the respective simplicial complex of a modeled object being an image of a couple made of a meshing of a parametric domain of a parametric view function and the modeled object, by composition of the parametric view function with a signature function, the parametric view function being continuous over the parametric domain and over a space of the modeled object, and the signature function being continuous over a range of the parametric view function.

* * * * *

UNITED STATES PATENT AND TRADEMARK OFFICE
CERTIFICATE OF CORRECTION

PATENT NO. : 10,719,549 B2  
APPLICATION NO. : 15/793774  
DATED : July 21, 2020  
INVENTOR(S) : Andre Lieutier Page 1 of 1

It is certified that error appears in the above-identified patent and that said Letters Patent is hereby corrected as shown below:

On the Title Page

Item (71), delete "Systems" and insert --Systemes--.

Signed and Sealed this  
First Day of September, 2020

Andrei Iancu  
*Director of the United States Patent and Trademark Office*